United States Patent [19]

Stefanou

[11] Patent Number: 4,459,634

[45] Date of Patent: Jul. 10, 1984

[54] REVERSE FIELD STABILIZATION OF POLARIZED POLYMER FILMS

[75] Inventor: Harry Stefanou, Wayne, Pa.

[73] Assignee: Pennwalt Corporation, Philadelphia, Pa.

[21] Appl. No.: 436,096

[22] Filed: Oct. 22, 1982

[51] Int. Cl.³ .............................................. H01G 7/02
[52] U.S. Cl. .................................. 361/233; 29/25.35; 307/400
[58] Field of Search .......................... 361/225, 229, 233; 307/400; 29/25.35; 310/357, 800

[56] References Cited

U.S. PATENT DOCUMENTS

| | | | |
|---|---|---|---|
| 3,660,736 | 5/1972 | Igarashi et al. | 361/233 |
| 4,055,878 | 11/1977 | Radice | 361/233 X |
| 4,356,424 | 10/1982 | Marcus | 361/233 X |
| 4,365,283 | 12/1982 | Radice | 361/233 |
| 4,392,178 | 7/1983 | Radice | 361/233 |

Primary Examiner—Harry E. Moose, Jr.

[57] ABSTRACT

This invention concerns a method for stabilizing polarized polymeric piezoelectric films wherein a polarized polymeric piezoelectric film is exposed to an electric field of reverse polarity to that employed in the polarization step for a period sufficient to remove unstable homo- and hetero-charges but insufficient to depolarize useful charges in the final film.

9 Claims, 3 Drawing Figures

REVERSE FIELD STABILIZATION OF POLARIZED POLYMER FILMS

STATEMENT OF THE INVENTION

This invention concerns a method for stabilizing polarized polymeric piezoelectric films wherein a polarized polymeric piezoelectric film is exposed to an electric field of reverse polarity to that employed in the polarization step for a period sufficient to remove unstable homo- and hetero-charges but insufficient to depolarize useful charges in the final film. In the preferred embodiment, the field of reverse polarity is applied substantially immediately after polarization, although long delays between polarization and stabilization can be tolerated.

BACKGROUND

Films of dielectric materials have been observed to be capable of acquiring a static electric charge upon being poled (i.e., being exposed to a dc field) which static charge is quasi-permanent, the degree of permanency being dependent largely upon the chemical constitution of the film. Such a charge, due largely to trapped positive and negative carriers positioned at or near the two surfaces of the dielectric respectively, produces what is known as an electret.

In addition to being capable of acquiring a static electric charge (and, as a result acquiring an electrostatic field), a certain limited class of film also acquires an ordered internal molecular orientation when exposed to a dc field so that even when the static (or electret characterizing) charges are dissipated, the film thereafter possesses the property of being able to generate an electric current between the electrically connected opposed surfaces by changing the pressure imposed on the opposed surfaces. This property is known as the piezoelectric effect and some such film (e.g., film made from polyvinylidene fluoride (PVDF) also possesses a pyroelectric effect (i.e., the property of producing electron flow by changing the temperature of the film). Also, when a voltage is applied to the opposite surfaces of a piezoelectric film, a reverse piezoelectric effect occurs, i.e., the film deforms physically in proportion to the voltage applied to it.

The production of electrets and piezoelectric film by poling is well known in the art. A preferred system for the continuous poling of piezoelectric sensitive film using a corona discharge to induce the piezoelectric charge is described and claimed in U.S. applications to Radice, Ser. Nos. 197,463 and 197,466, each filed Oct. 16, 1980, now U.S. Pat. Nos. 4,392,178 and 4,365,283, and incorporated herein by reference. Regardless of the mechanics of poling, it has been observed that poled film possesses unstable charges, sometimes described as unstable homo- or hetero-charges. Until such unstable charges are removed, the piezoelectric or pyroelectric properties of the poled structure will vary. The art teaches several techniques for removing such unstable charges as by use of pressure while the two surfaces of the poled structure are short circuited (U.S. Pat. No. 4,055,878, dated Nov. 1, 1977), by use of heat treatment (U.S. Pat. No. 3,660,736, dated May 2, 1972 and U.S. Pat. No. 3,833,503, dated Sept. 3, 1974) and by immersion in water (U.S. Pat. No. 3,793,715, dated Feb. 26, 1974). The present invention provides a quicker and more efficient way of removing such unwanted charges.

THE DRAWINGS

DETAILED DESCRIPTION OF THE INVENTION

Figure 1:
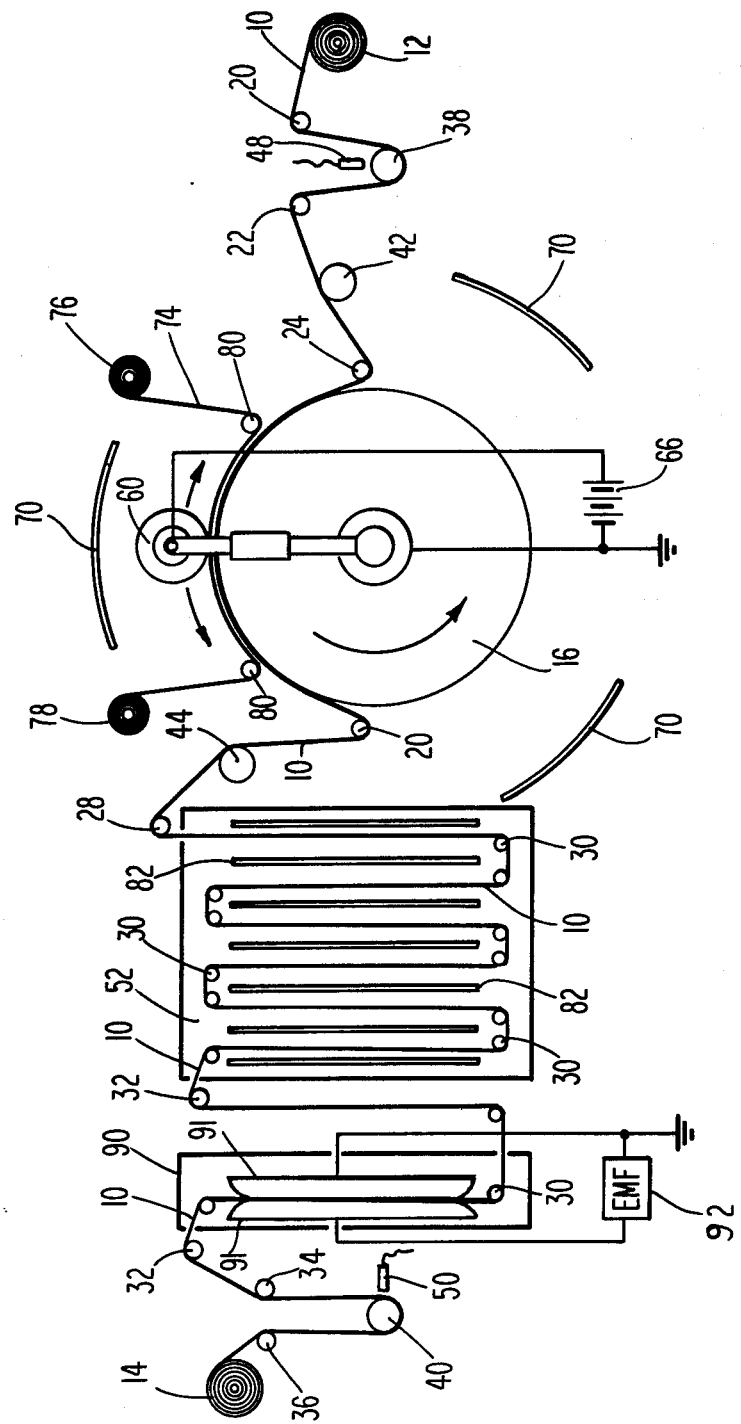
FIG. 1 is a diagrammatic representation of a corona discharge system embodying reverse field stabilization as taught in the present invention.

In FIG. 1, the polymeric material to be poled is illustrated as film 10, suitably KYNAR, a polyvinylidene fluoride product of Pennwalt Corporation, Philadelphia, Pennsylvania, assignee of the present invention. Films of polyvinylidene fluoride (hereinafter referred to as $PVF_2$) exhibit piezoelectric properties which may be enhanced by subjecting the films to polarizing or "poling" techniques. Film 10 may be uniaxially, bi-axially, or multi-axially oriented. The invention is not limited to $PVF_2$. Other thermopolastic or polymeric (including copolymeric) materials such as polyvinyl fluoride, polyvinyl chloride, and the copolymers of vinylidene fluoride/trifluoroethylene and vinylidene fluoride/tetrafluoroethylene, for example, may be used advantageously with the improved poling apparatus to be hereinafter disclosed.

Film 10 is wound around supply spool 12, and after poling of the film, is caused to be rewound on take-up spool 14. Drum 16, intermediate the spools, is rotated by a motor (not shown), suitably a stepping motor, and causes film 10 to be transported along a designated path, i.e., a path defined by conventional rollers including guide or idler rollers 20, 22, 24, 26, 28, 30, 32, 34 and 36; dancer rollers 38 and 40; and spreader rollers 42 and 44. Dancer rollers 38 and 40 may be suspended, caused to rest on a pivot arm, or otherwise suitably disposed. Dancer roller 38 will "dance" upwardly when tension on film 10 between drum 16 and supply spool 12 increases. A proximity switch 48 may be disposed adjacent dancer roller 38 for actuating a suitable motor (not shown) which will play out additional film from supply spool 12 until tension on film 10 is returned to normal. Another proximity switch 50 may be disposed in operable relationship to dancer roller 40 to control tension of film 10 between take-up spool 14 and heating chamber 52.

Careful adjustment of the motors (not shown) controlling rotation of drum 16 and take-up spool 14 obviate the need for the proximity switches.

Conventional spreader rollers 42 and 44 maintain film 10 in a substantially wrinkle-free condition prior and subsequent to corona discharge treatment.

Cooperating with rotating drum 16, in the poling of film 10 is a corona discharge electrode 60 across which a dc voltage source 66 is applied. Electrode 60 oscillates in a direction normal to the axis of rotation of drum 16 as drum 16 rotates.

Flexible radiant heaters 70 are provided about drum 16 and electrode 60 if heat is desired thereat.

In order to preserve the physical integrity of film 10 during poling, a protective film or co-film 74 is preferably interposed between film 10 and electrode 60 such that the electrode 60 rolls on the co-film which is transported at a substantially identical speed with film 10. Co-film 74 may be wound on co-film supply spool 76 and rewound on co-film take-up spool 78, the latter being powered by a constant torque or slip drive motor, for example. Alternatively, the reuseable co-film 74 may be made seamless and transported over film 10 as an endless belt. Guide or idler rollers 80 define the path of the co-film.

Co-film 74 is suitably a copolymer of monomers vinylidene fluoride and tetrafluoroethylene in a ratio of about 70-30 weight % respectively.

Heating chamber 52 includes a plurality of thermostatically controlled radiant panels 82 of any suitable design.

Reverse field stabilization chamber 90 contains a pair of electrodes 91, charged by voltage source 92 (which may be ac or dc) in contact with film 10 thereby to subject film 10 to a charge opposite in polarity to the charge applied by that generated between electrode 60 and drum 16. The reverse field is maintained for at least about 0.001 seconds and is applied at a temperature between about 20° C. and the poling temperature. Maintenance of exposure of the film to the reverse field for from 5 to 60 seconds is preferred.

In addition to applicability to use upon film poled by corona discharge, the reverse field stabilization process of the present invention is also applicable to film which has been poled between charged plates, e.g. as taught in Sprout, U.S. Ser. No. 248,151 filed Mar. 30, 1981 and incorporated herein by reference.

The following example is cited to illustrate the invention. It is not intended to limit it in any fashion.

Figure 2:
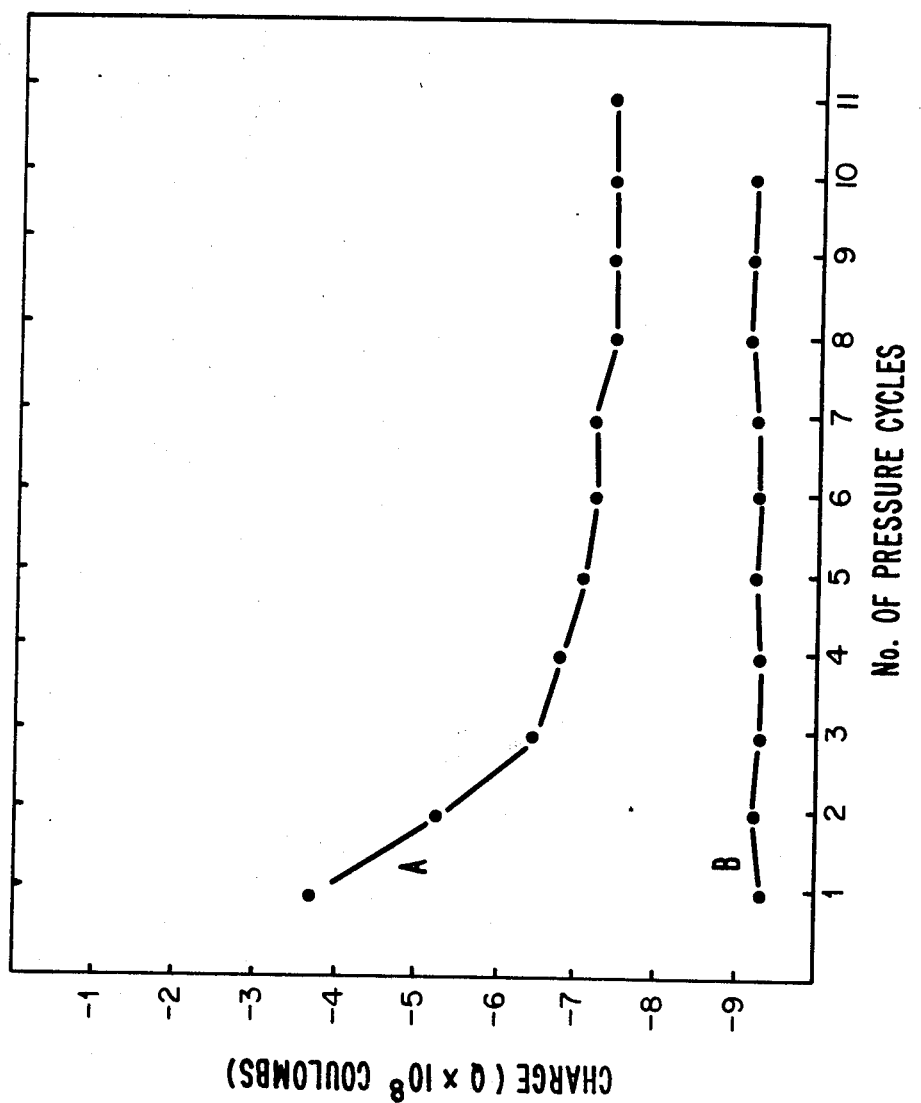
FIG. 2 is a graph on which electrical charge in $Q \times 10^{-8}$ coulombes is plotted as ordinate against number of pressure cycles as abscissa for a curve "A" representing electrical charge characteristics of a film substantially immediately after poling and at curve "B", the electrical charge characteristics for the same film after twelve hours stabilization at 3000 psi.
Figure 3:
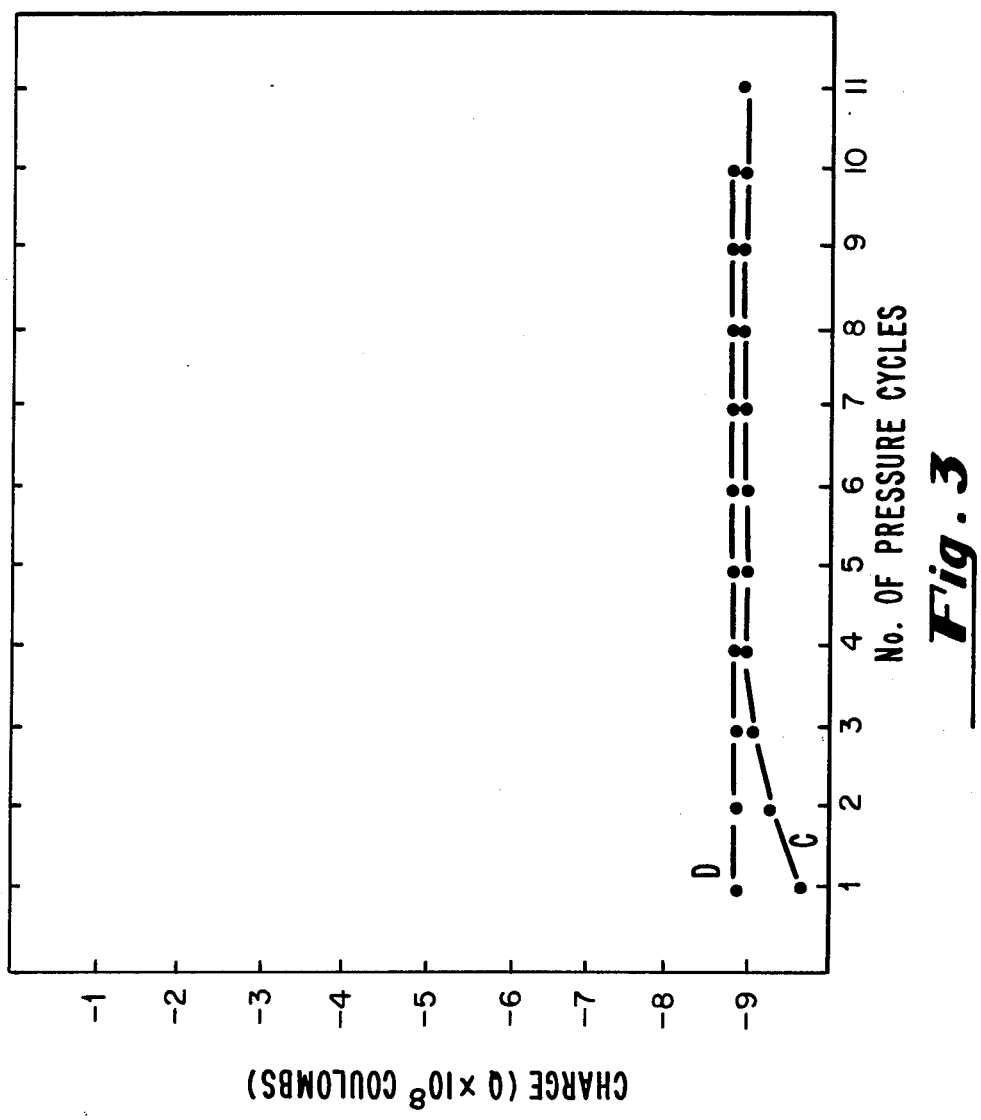
FIG. 3 is a graph having the same coordinate as those described for FIG. 2 but wherein curve "C" represents the electrical charge characteristics of a film substantially immediately after poling followed by reverse field stabilization according to the present invention and curve "D" represents the electrical charge characteristics of the same film after twelve hours stabilization at 3000 psi.

EXAMPLE 1 a. An oriented polyvinylidene fluoride film was poled between charged plates by conventional techniques. Without any stabilization to remove unstable homo- or hetero-charges, the poled film was cycled on a Carver press operating at between 1000 and 2000 pounds and the surface charge on the film's surface was measured with a high impedance electrometer. The readings, for on the electrometer for eleven cycles is shown as curve "A" on FIG. 2, demonstrating that approximately eight cycles are required before the piezoelectric activity of the film appears stable. When the same film was stabilized by the process of U.S. Pat. No. 4,055,878 for twelve hours, commencing substantially immediately after poling as taught, readings are obtained upon the cyclic application of pressure as shown on curve "B" of FIG. 2. Comparison of curves A and B on FIG. 2 demonstrate that the stabilization applied to the film of curve B has resulted in removal of additional charge from the film of curve B than was present on the apparently stabilized film of curve A; furthermore the film of curve B provides a higher level of piezoactivity than the partially stabilized film of curve A.

b. A second film, poled identically to that reported in paragraph "a" above was stabilized by the process of U.S. Pat. No. 4,055,878 to produce a film providing upon cycled on the carver press electrometer readings indicated as curve "D" on FIG. 3; while a sample film reverse-field stabilized at from 50° to 55° C. for 15 seconds at about 10% of the voltage applied in the poling provided the electrometer readings indicated as curves C on FIG. 3 and D of FIG. 3 demonstrates that reverse-field stabilization pursuant to the present invention accomplished in 15 seconds is at least equivalent in effectiveness in removing unstable charges as a twelve hour conventional pressure stabilization pursuant to the teachings of the referenced patent.

Many equivalent modifications will be apparent to those skilled in the art from a reading of the above without departing from the spirit of the invention.

What is claimed:

1. A process for removing unstable charges from a poled film which comprises exposing said film after poling to an electric field of reverse polarity to that used in the poling.

2. The process of claim 1 wherein said film is exposed to said field of reverse polarity substantially immediately after poling.

3. The process of claim 1 wherein the film exhibits piezo or pyro electric properties.

4. The process of claim 3 wherein the film comprises polyvinylidene fluoride.

5. The process of claim 4 wherein the poling is performed by corona discharge.

6. The process of claim 4 wherein the poling is performed between charged electrodes.

7. The process of claim 6 wherein said film is exposed to said field of reverse polarity for at least 0.001 seconds.

8. The process of claim 7 wherein said film is exposed to said field of reverse polarity for from 5 to 15 minutes.

9. The process of claim 6 wherein a dc source is employed to provide said electric field of reverse polarity.

* * * * *